United States Patent
Son et al.

(10) Patent No.: US 8,768,304 B2
(45) Date of Patent: Jul. 1, 2014

(54) APPARATUS AND METHOD FOR PROVIDING ETIQUETTE CALL MODE IN MOBILE DEVICE

(75) Inventors: Beak Kwon Son, Gyeonggi-do (KR);
Sang Ki Kang, Gyeonggi-do (KR);
Yang Su Kim, Gyeonggi-do (KR); Jae Hyun Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/298,554

(22) Filed: Nov. 17, 2011

(65) Prior Publication Data

US 2012/0172022 A1     Jul. 5, 2012

(30) Foreign Application Priority Data

Jan. 3, 2011    (KR) .................. 10-2011-0000074

(51) Int. Cl.
*H04M 1/66*    (2006.01)

(52) U.S. Cl.
USPC ............................ 455/411; 455/410; 455/528

(58) Field of Classification Search
USPC ........................................................ 455/411
See application file for complete search history.

(56) References Cited

U.S. PATENT DOCUMENTS

| | | | |
|---|---|---|---|
| 6,281,925 B1 * | 8/2001 | Kosaka | 348/14.02 |
| 6,327,483 B1 * | 12/2001 | Taniguchi | 455/569.1 |
| 6,744,882 B1 * | 6/2004 | Gupta et al. | 379/387.01 |
| 7,283,635 B1 * | 10/2007 | Anderson et al. | 381/74 |
| 2002/0068537 A1 * | 6/2002 | Shim et al. | 455/177.1 |
| 2005/0215290 A1 * | 9/2005 | Wakabayashi et al. | 455/563 |
| 2006/0111094 A1 * | 5/2006 | Lee | 455/418 |
| 2010/0022280 A1 * | 1/2010 | Schrage | 455/567 |
| 2010/0184488 A1 * | 7/2010 | Takada | 455/570 |

FOREIGN PATENT DOCUMENTS

| | | |
|---|---|---|
| DE | 19949359 A1 | 4/2000 |
| DE | 10352676 A1 | 6/2005 |
| KR | 10-0580755 B1 | 5/2006 |
| KR | 20060097285 A | 9/2006 |

\* cited by examiner

*Primary Examiner* — Kashif Siddiqui
*Assistant Examiner* — Sayed T Zewari
(74) *Attorney, Agent, or Firm* — Cha & Reiter, LLC (57) ABSTRACT

An apparatus and method are provided to output a received call with a volume adjusted to a reference level range in the etiquette call mode. In the method for providing the etiquette call mode of a mobile device, the apparatus determines whether the etiquette call mode is activated in a call mode. When the etiquette call mode is activated, the apparatus establishes a transmission gain to a given gain value and also establishes a reception gain to a specific gain value corresponding to a minimum receiving volume level. Then the apparatus amplifies a received call by means of the established reception gain, adjusts a volume of the amplified received call to a given reference level range, and outputs the adjusted received call through a speaker.

20 Claims, 4 Drawing Sheets

GAIN CHARACTERISTICS

FIG. 4

APPARATUS AND METHOD FOR PROVIDING ETIQUETTE CALL MODE IN MOBILE DEVICE

CLAIM OF PRIORITY

This application claims, pursuant to 35 USC 119, to that patent application filed in the Korean Intellectual Property Office on Jan. 3, 2011 and afforded serial number 10-2011-0000074, the contents of which are incorporated by reference, herein.

BACKGROUND OF THE INVENTION

1. Field of the Invention

The present invention relates to the field of mobile devices and, more particularly, to an apparatus and method for outputting a received call with a volume adjusted to a reference level range in an etiquette call mode.

2. Description of the Related Art

With remarkable growths of related technologies, a great variety of mobile devices are increasingly being popularized. In the case of a mobile communication device, for example, in addition to normal communication functions, such as a voice call and a short message service, various optional functions have been, and continue to be, incorporated into the mobile devices and the use of these new functions are becoming more essential to the average user. For example, a portable broadcasting (e.g., DMB (Digital Multimedia Broadcasting) or DVB (Digital Video Broadcasting)), a digital music play (e.g., MP3 (MPEG audio layer-3)), a digital camera, a data communication, a wireless Internet access, a listening to the radio, an earphone call, and the like, are functions (applications) that are incorporated in common mobile communication devices. In addition, the business community has adopted the use of new features and applications to improve productivity and intercommunications among their employees. Smart phones, such as the SAMSUMG GALAXY S and tablet PCs, such as the SAMSUMG GALAXY TAB are examples of mobile communication devices of incorporating converging technologies that prove users with all-in-one capabilities. Samsung, Samsung Galaxy S and Samsung Galaxy Tab are registered Trademarks of the Samsung Electronics Co., Ltd., Seoul, Korea.

For example, mobile devices provide a function (whisper call mode) to set a transmission gain to a maximum value under circumstances. However, this maximum gain value may be inconvenient to receive or place a call. For example, when the user is in a meeting or at a theater, etc., the ring of the phone may not be appreciated or allowed. The maximum transmission gain of a microphone may allow the recipient to hear a caller who is speaking in a low voice (a whisper) well. However, when the caller talks loudly, a received call may be easily heard through a speaker by persons around the recipient. In a quiet situation, this may cause noise pollution and may also invade the caller's privacy. Even though the recipient may reduce the volume of a received call through a volume key, this may cause the recipient to fail to hear a caller's low voice.

BRIEF SUMMARY OF THE INVENTION

Accordingly, the present invention is to address the above-mentioned problems and/or disadvantages and to offer at least the advantages described below.

An aspect of the present invention is to provide an apparatus and method for outputting a received call with a volume adjusted to a reference level range in an etiquette call mode.

Another aspect of the present invention is to an apparatus and method for differentially establishing a reference level range, depending on a receiving volume level, used to adjust the volume of a received call outputted through a speaker in an etiquette call mode.

According to one aspect of the present invention, provided is an apparatus for providing an etiquette call mode of a mobile device, the apparatus comprising: a radio frequency (RF) unit configured to transmit a sending call and to receive a received call in a call mode; an audio processing unit configured, when the etiquette call mode is activated in the call mode, to establish a transmission gain to a given gain value, to establish a reception gain to a specific gain value corresponding to a minimum receiving volume level, to amplify the received call by means of the established reception gain, and to adjust a volume of the amplified received call to a given reference level range; and a control unit configured to control operations of the RF unit and the audio processing unit.

According to another aspect of the present invention, provided is a method for providing an etiquette call mode in a mobile device, the method comprising: determining whether the etiquette call mode is activated in a call mode; when the etiquette call mode is activated, establishing a transmission gain to a given gain value and also establishing a reception gain to a specific gain value corresponding to a minimum receiving volume level; amplifying a received call by means of the established reception gain; adjusting a volume of the amplified received call to a given reference level range; and outputting the adjusted received call through a speaker.

According to another aspect of the present invention, provided is a mobile terminal, the mobile terminal comprising: an A/D converter digitizing a received signal; a first amplifier amplifying the digitized received signal; a encoder encoding the amplified digitized received signal; a decoder decoding an encoded received signal and generating a decoded signal; a second amplifier amplifying the decoded signal; a switch receiving the amplified decoded signal, the switch having a first output and a second output; a volume adjustor connected to the first output of the switch, the volume adjustor adjusting a volume of the received amplified decoded signal, wherein the volume is adjusted based on a selectable reference point curve; a D/A converter connected to the second out of the switch and the volume adjustor; a speaker receiving an output of the D/A converter, said speaker outputting the output of the D/A converter; a control unit receiving the encoded amplified digitized received signal from the encoder and providing the encoded received signal to the decoder.

Aspects of the present invention may output a received call with a volume adjusted to a given reference level range in an etiquette call mode. Therefore, even though the caller talks loudly, a loud received call may be outputted through the speaker by reducing the volume of the received call to a set reference level. Additionally, when the caller talks in a low voice, the received call can be heard by a recipient by increasing the volume of the received call to a set reference level. The reference level may be pre-set or adjusted under user control.

Other aspects, advantages, and salient features of the invention will become apparent to those skilled in the art from the following detailed description, which, taken in conjunction with the annexed drawings, discloses exemplary embodiments of the invention.

DETAILED DESCRIPTION OF THE INVENTION

Exemplary, non-limiting embodiments of the present invention will now be described more fully with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Furthermore, well known or widely used techniques, elements, structures, and processes may not be described or illustrated in detail to avoid obscuring the essence of the present invention. Although the drawings represent exemplary embodiments of the invention, the drawings are not necessarily to scale and certain features may be exaggerated or omitted in order to better illustrate and explain the present invention.

Figure 1:
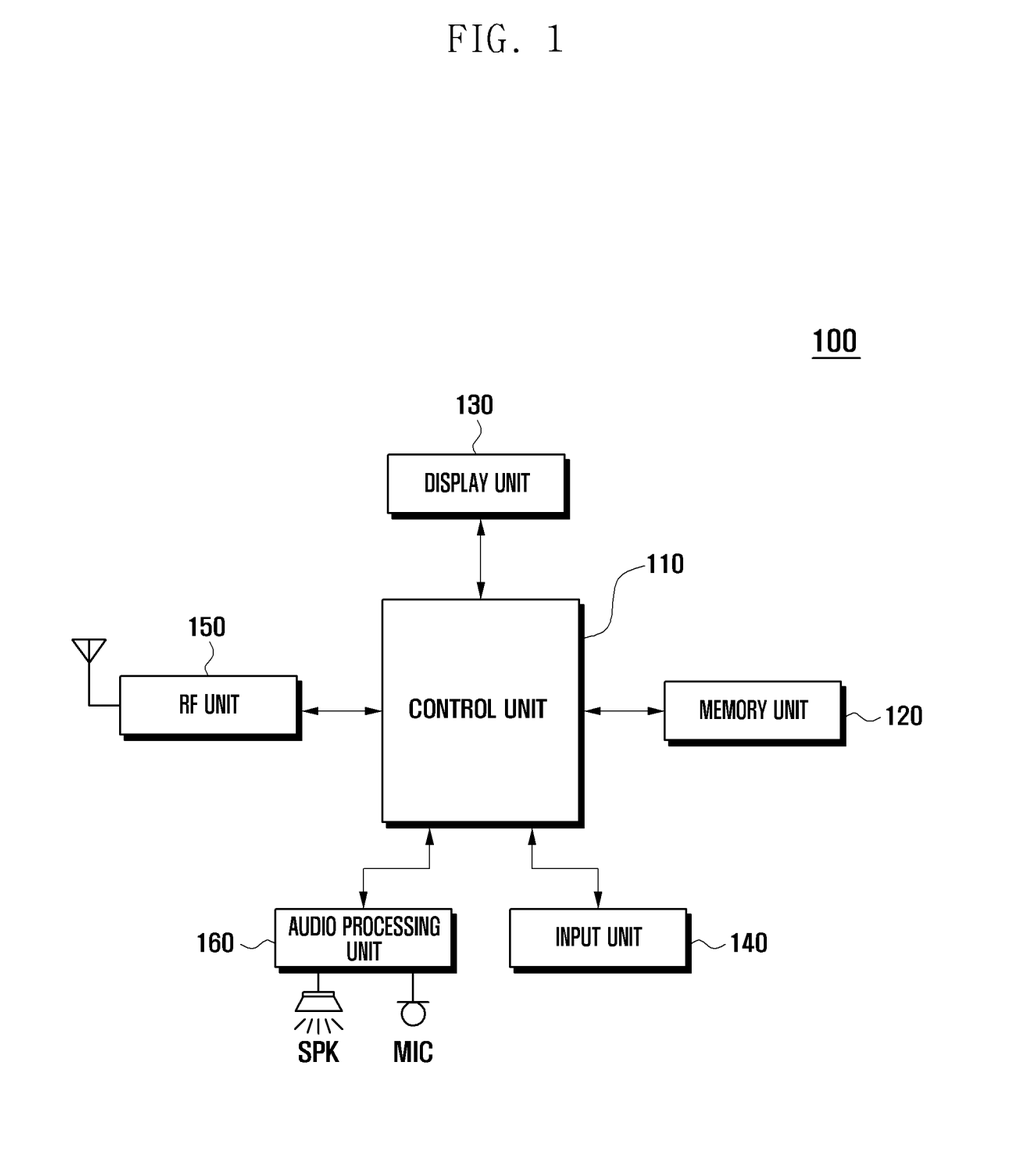
FIG. 1 is a block diagram illustrating the configuration of a mobile device in accordance with an exemplary embodiment of the present invention.
Figure 2:
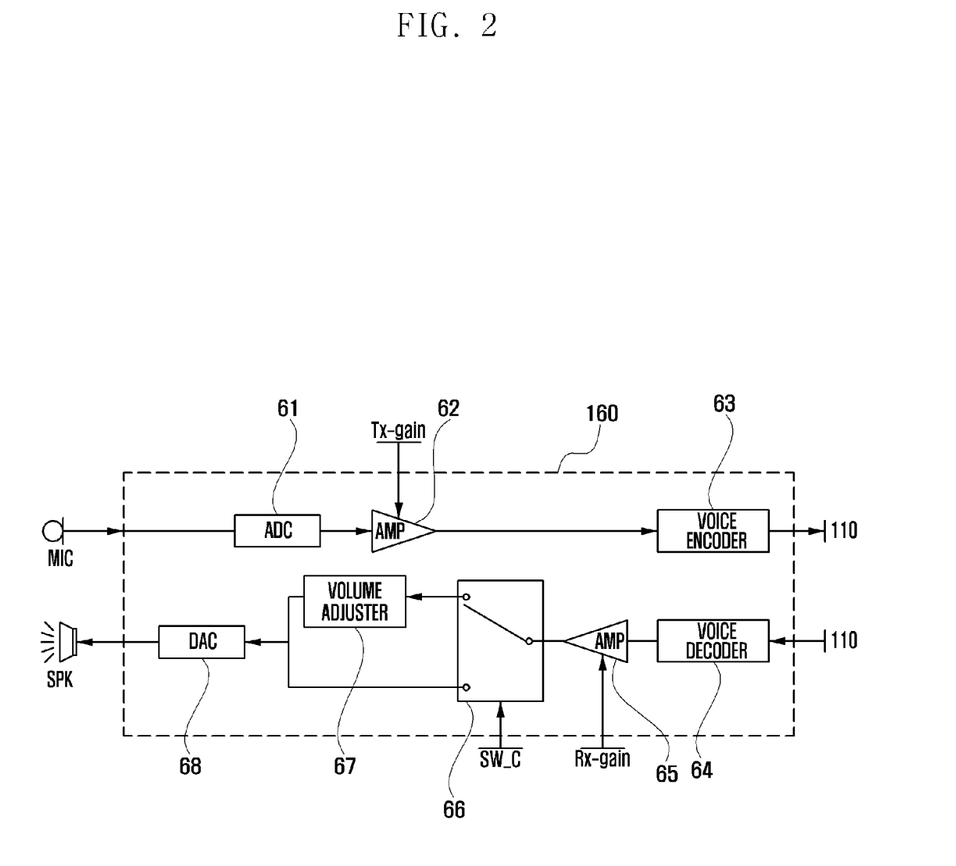
FIG. 2 is a block diagram illustrating the configuration of an audio processing unit in accordance with an exemplary embodiment of the present invention.
Figure 3:
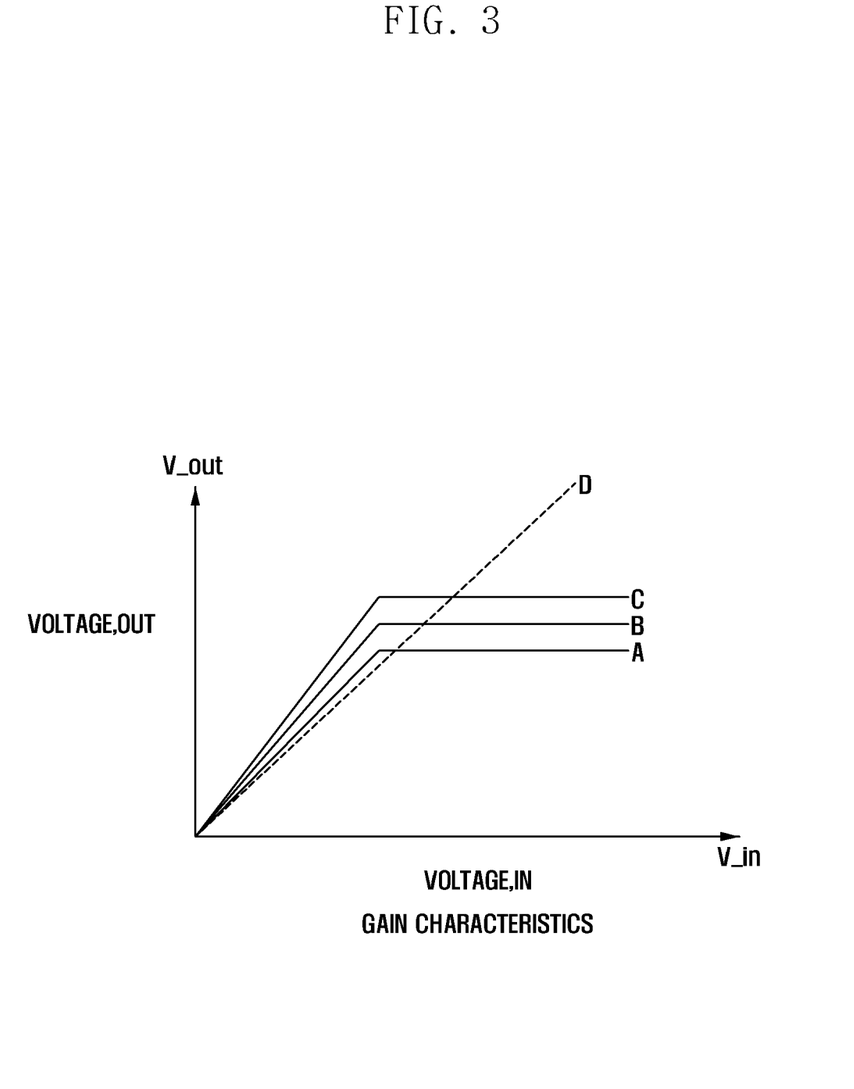
FIG. 3 is a graph illustrating a volume adjustment of a volume adjuster in an etiquette call mode in accordance with an exemplary embodiment of the present invention.

FIG. 1 is a block diagram illustrating the configuration of a mobile device in accordance with an exemplary embodiment of the present invention. FIG. 2 is a block diagram illustrating the configuration of an audio processing unit in accordance with an exemplary embodiment of the present invention. FIG. 3 is a graph illustrating a volume adjustment of a volume adjuster in an etiquette call mode in accordance with an exemplary embodiment of the present invention.

Referring to FIGS. 1 to 3, the mobile device 100 may include a control unit 110, a memory unit 120, a display unit 130, an input unit 140, a radio frequency (RF) unit 150, and an audio processing unit 160. Particularly, the audio processing unit 160 may include an analog-to-digital (A/D) converter 61, a first amplifier 62, a voice encoder 63, a voice decoder 64, a second amplifier 65, a switch 66, a volume adjuster 67, and a digital-to-analog (D/A) converter 68.

The input unit 140 may include a plurality of input keys that create input signals for entering numerical or literal (alphanumeric) information and function keys that create input signals for setting or controlling various functions of the mobile device 100. The function keys may represent navigation keys, side keys, shortcut keys, and the like. Particularly, the input unit 140 may include a volume key for adjusting the level of a received call in a call mode, and a function key for activating an etiquette mode. The input unit 140 may be formed of one, or combination of, a touch pad, a touch screen, a keypad with a normal key layout, and a keypad with a QWERTY key layout. The input unit 140 sends the input signals to the control unit 110.

The display unit 130 presents information, including various menus associated with the mobile device 100, inputted by a user or offered to a user. For instance, the display unit 130 may visually offer a variety of screen views in connection with the use of the mobile device 100. For example, the screen views may represent an idle screen, a menu screen, a message writing screen, a call screen, and the like. Particularly, the display unit 130 may output a specific image that notifies the user of the activation of an etiquette call mode. The display unit 130 may be formed of LCD (Liquid Crystal Display), OLED (Organic Light Emitting Diodes), AMOLED (Active Matrix OLED), or another technology suitable for displaying images. If the display unit 130 is formed of a touch screen, the display unit 130 may also operate as the input unit 140.

The RF unit 150 establishes communication channels for a call and for data transmission. Namely, the RF unit 150 establishes at least one of a voice call channel, a data transmission channel and a video call channel with a base station. Then the RF unit 150 may send or receive voice signals and/or video signals to/from a counterpart mobile device through the established voice, data, and/or video call channel under the control of the control unit 110. Additionally, the RF unit 150 may include an RF transmitter (not shown) that up-converts the frequency of an outgoing signal and then amplifies the up-converted signal, an RF receiver (not shown) that amplifies, with a low-noise amplifier, an incoming signal and then down-converts the frequency of the signal, and a separator (not shown) that separates the outgoing signal and the incoming signal. Particularly, the RF unit 150 may transmit a sending call amplified by a given (known) gain (e.g., the maximum gain) to a counterpart mobile device in an etiquette mode.

The audio processing unit 160 may be formed of audio components, such as CODECs (coders/decoders) and audio amplifiers, which are used to amplify and encode audio signals to be transmitted and amplify received audio signals to be decoded. The audio processing unit 160 is connected to a microphone (MIC) and a speaker (SPK). The audio processing unit 160 may process voice signals inputted from the microphone and then send them to the control unit 110, and further process voice signals inputted from the control unit 110 and output them through the speaker. The audio processing unit 160 may also output various audio signals (e.g., MP3 files, audio signals resulting from the playback of video files, etc.) generated in the mobile device 100 through the speaker. Particularly, in an etiquette call mode, the audio processing unit 160 may establish a transmission gain to a given gain value (e.g., a maximum gain value), and establish a reception gain to a specific gain value corresponding to a minimum receiving volume level. Furthermore, the audio processing unit 160 may amplify a received call by means of the reception gain and then adjust the volume of the received call to a given reference level range.

As shown in FIG. 2, the audio processing unit 160 may include A/D converter 61, first amplifier 62, voice encoder 63, voice decoder 64, second amplifier 65, switch 66, volume adjuster 67, and D/A converter 68.

The A/D converter 61 may convert analog signals received from the microphone into digital signals. Since the processing associated with the A/D converter 61 is understood by those skilled in the art, a detailed description will be omitted herein.

The first amplifier 62 may amplify digital signals by means of the transmission gain (Tx_gain) established by the control unit 110. As well known in the art, a gain refers to the ratio of the amplitude of an output signal to the amplitude of an input signal. Namely, the first amplifier 62 may output digital signals inputted and amplified with a given ratio. Particularly, in an etiquette call mode, the first amplifier 62 may amplify digital signals by means of the maximum gain. This allows the recipient to hear a caller's voice even though the caller talks in a low voice (a whisper). Meanwhile, the transmission gain may be established to the maximum gain value of the first amplifier 62 or to a specific value reduced from the maximum gain value in consideration of stability of the first amplifier 62.

The voice encoder 63 is used to encode voice signals. The voice encoder 63 may encode digital signals amplified provided through the first amplifier 62 into a specific form suitable for transmission through the RF unit 150 and then may send them to the control unit 110. As well known in the art, encoding of digital signals may be performed in various manners.

The voice decoder 64 may also decode digital signals (i.e., voice signals) received from the control unit 110. Namely, the voice decoder 64 performs the opposite function to that of the voice encoder 63.

The second amplifier 65 may receive digital signals from the voice decoder 64 and then amplify them by means of the reception gain (Rx_gain) corresponding to the receiving volume level. Particularly, in an etiquette call mode, the second amplifier 65 may amplify digital signals received from the voice decoder 64 by means of the minimum gain set under the control of the control unit 110. The reception gain may be established to a specific gain value corresponding to the minimum receiving volume level. This prevents a loud voice from being outputted through the speaker.

The switch 66 may perform a switching operation according to a control signal (SW_C) from the control unit 110 such that digital signals amplified by the second amplifier 65 may be sent to the D/A converter 68 through the volume adjuster 67 or directly sent to the D/A converter 68. Specifically, the switch 66 connects the second amplifier 65 to the D/A converter 68 in a normal call mode or a conventional whisper call mode, and connects the second amplifier 65 to the volume adjuster 67 in an etiquette call mode.

The volume adjuster 67 may be activated in an etiquette call mode and then may adjust the volume of digital signals amplified by the second amplifier 65 to a reference level range. That is, the volume adjustor 67 may adjust a volume of the received amplified decoded signal via the switch 66, wherein the volume is adjusted based on a selectable reference point curve (referring to FIG. 3). The volume adjustor 67 selects one of the selectable reference points in response to a signal from the control unit 110. Specifically, in order to adjust the volume of digital signals of a received call to the reference level range, the volume adjuster 67 may increase signals of lower amplification outputted from the second amplifier 65 and may reduce higher signals outputted from the second amplifier 65. Therefore, even though the gain of the second amplifier 65 is set to the minimum value, a received call having a low voice input signal can be heard by a user, and a received call having a large input signal can be reduced in volume before being presented through the speaker.

FIG. 3 illustrates an exemplary Voltage (in) versus Voltage (out) gain chart typical for illustrating an amplifier gain characteristics. The amplifier gain may be determined by the ratio of the voltage output for each voltage input. For example, a minimum gain setting may be a ratio of one (1) wherein a known voltage input produces the same known voltage output. Thus, with a large input signal, the output signal will be equally as large, even with a minimum gain (or volume level) setting.

Referring to FIG. 3, a dotted graph line D plots a normal relation between input signals and output signals, wherein the voltage out, in this case, increases linearly with the voltage input. Curved graph lines A, B and C represent optional levels for the volume adjuster 67 that adjusts a receiving volume to the reference level range. In case of a volume adjustment based on the dotted graph line D, a loud received call may be outputted through the speaker even though the reception gain is established to the minimum. Therefore, when the input signal level is higher than a specific value, the volume adjuster 67 may reduce the output signals to a given value as shown in the curved graph lines A, B and C so that the loud voice cannot be outputted through the speaker. Rather a signal with a lower output volume is outputted through the speaker.

Additionally, when the input signal level is lower than a specific value, the volume adjuster 67 may increase the output signals than in normal case based on the dotted graph line D to increase the volume of a low voice caused by the minimum gain of the second amplifier 65.

Meanwhile, the curved graph lines A, B and C show different receiving volume levels that may be selectively used in an etiquette call mode. When a user presses a volume key in an etiquette call mode, the volume adjuster 67 may adjust a receiving volume level using one of the curved graph lines A, B and C. The selection of the receiving volume level may correspond to a number (degrees) of presses of the volume key. For instance, after an etiquette call mode is activated, the volume adjuster 67 may adjust the volume of a received call to a reference level range by using the curved graph line A. If a user raises the receiving volume level by one step through a first depression of the volume key, the volume adjuster 67 may adjust the volume of a received call to a reference level range by using the curved graph line B, wherein reference level range using curve graph A may be considered a default reference level. The volume adjuster 67 may be formed of an automatic gain controller or a compander, (i.e., a signal processing technique that uses both compression and expansion to improved dynamic range), which is well known in the art and need not be discussed in detail, herein. The specific values associated with each of reference curves A-D may be stored in a memory in a list form, which is accessed based on a default condition, (i.e., normal mode) and/or selected by the number of presses of the volume key.

The D/A converter 68 may convert digital signals into analog signals and then send them to the speaker. Since the operation of D/A converter 68 is understood by those skilled in the art, a detailed description will be omitted herein.

The memory unit 120 may store programs and data required for operations of the mobile device 100, including an operating system (OS) for the mobile device 100 and applications for executing various optional functions of the mobile device 100, such as a sound reproduction function, an image or video playback function, and the like. Particularly, the memory unit 120 may store a table or list that records the transmission gains of the first amplifier 62 and the reception gains of the second amplifier 65 established according to call modes (i.e., a normal call mode and an etiquette call mode) and receiving volume levels. Additionally, the memory unit 120 may store an etiquette call program for controlling the activation and inactivation (ON/OFF) of an etiquette call mode and for adjusting sending and receiving volumes in the etiquette call mode.

The control unit 110 controls the operation of the mobile device 100 and controls signal flows between the internal blocks of the mobile device 100. Particularly, when a call mode is executed, the control unit 110 may determine whether an etiquette call mode is activated. If the etiquette call mode is not activated, the control unit 110 may perform a normal call mode in which the transmission gain of the first amplifier 62 and the reception gain of the second amplifier 65 are established on the basis of the receiving volume level.

If the etiquette call mode is activated, the control unit 110 may establish the transmission gain of the first amplifier 62 to the maximum, establish the reception gain of the second amplifier 65 to the minimum, and control the switch 66 to connect the second amplifier 65 to the volume adjuster 67. Here, the volume adjuster 67 may adjust the volume of a received call outputted from the second amplifier 65 to a reference level range.

When a volume key signal is inputted in the etiquette call mode, the control unit 110 may maintain the minimum reception gain of the second amplifier 65 and control the volume adjuster 67 to adjust the volume of a received call according to the reference level range selected. That is, the signal that had been amplified by the second amplifier 65 is provided to the volume adjuster, which operates as another amplifier to adjust the output level. For example, referring back to FIG. 3, when a signal input to the volume adjuster is input with a value that would cause an output value greater than a limiting value of one of curves A, B or C (depending upon which curve is selected) then the output value is limited to the limiting value of the selected curve.

Selection of the curves A, B or C, may be performed for example in response to an input signal indicating a volume key depression during the etiquette mode. In this case, wherein the volume adjuster 67 uses the characteristics of curved graph line A, as a default value, the control unit 110, in response to the received input signal may adjust the volume using the curved graph line B or C, depending upon the number of depressions of the volume key.

In another embodiment, when a volume key signal is inputted in the etiquette call mode, the control unit 110 may change the reception gain of the second amplifier 65 to a corresponding one of receiving volume levels and may also control the switch 66 to connect the second amplifier 65 to the D/A converter 68. That is, the control unit 110 may change the call mode to the conventional whisper call mode. This is to put first a user's establishment for a receiving volume.

Although not illustrated in FIG. 1, the mobile device 100 of this invention may essentially or selectively include any other elements such as a camera module, a short range communication module, a broadcast receiving module, a digital sound play module such as an MP3 module, an internet access module, and the like. According to digital convergence tendencies, such other elements may be varied, modified and improved in various ways, and any other elements equivalent to the above elements may be additionally or alternatively equipped in the mobile device 100. Meanwhile, as will be understood by those skilled in the art, some of the above-mentioned elements in the mobile device may be omitted or replaced with another elements or functions.

Figure 4:
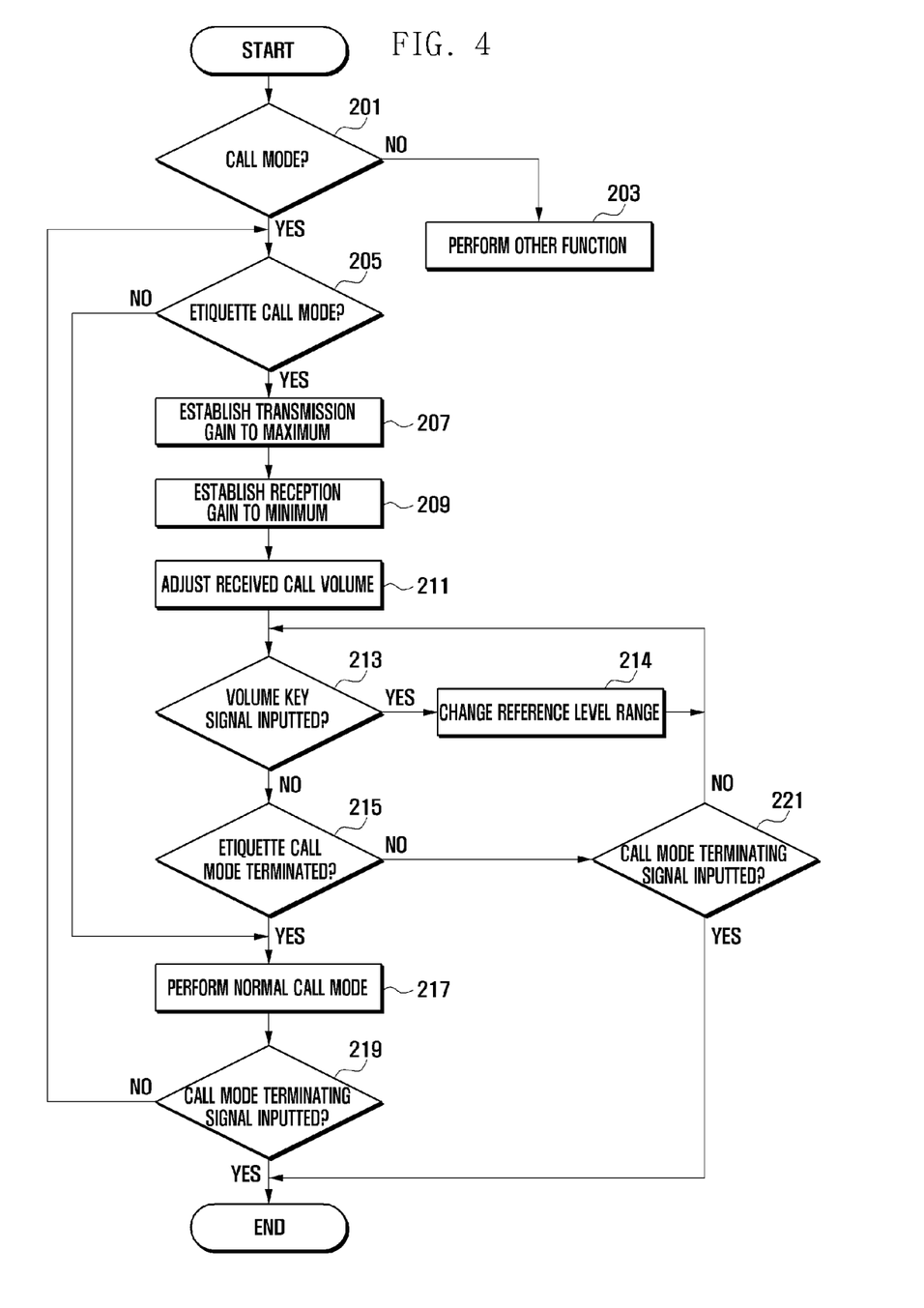
FIG. 4 is a flow diagram illustrating a process for providing an etiquette call mode of a mobile device in accordance with an exemplary embodiment of the present invention.

FIG. 4 is a flow diagram illustrating a process for providing an etiquette call mode of a mobile device in accordance with an exemplary embodiment of the present invention.

Referring to FIGS. 1 to 4, the control unit 110 may determine whether a call mode is executed (step 201). If the call mode is not executed, the control unit 110 may perform any other selected function (step 203). For instance, the control unit 110 may keep the idle state or perform a music play function, a video playback function, a digital camera function, etc. in response to a user's request. However, if the call mode is executed, the control unit 110 may further determine whether an etiquette call mode is activated (step 205). This etiquette call mode may be activated through an input of a predetermined function key or selection from a menu displayed on the touch screen.

If the etiquette call mode is not activated, the control unit 110 may perform a normal call mode (step 217), which will be described below. However, if the etiquette call mode is activated, the control unit 110 may establish the transmission gain, namely the gain of the first amplifier 62, to a given gain value (step 207). This allows the recipient to hear a caller's voice even though the caller talks in a low voice. Here, the given gain value may be the maximum gain value of the first amplifier 62 or a specific value reduced from the maximum gain value.

Then the control unit 110 may establish the gain of the second amplifier 65 to a specific gain value corresponding to a minimum receiving volume level (step 209). Also, the control unit 110 may activate the volume adjuster 67 and then adjust the volume of a received call to a reference level range through the volume adjuster 67 (step 211). For this, the control unit 110 may send a control signal (SW_C) to the switch 66 so that the second amplifier 65 is connected to the volume adjuster 67 in the etiquette call mode Since a volume level control of the volume adjuster 67 has been already discussed above, a detailed description will be omitted herein.

Thereafter, the control unit 110 may determine whether a volume key signal is inputted (step 213). If a volume key signal is inputted in the etiquette call mode, the control unit 110 may change a reference level range (step 214) and then may return to the step 213. Specifically, the control unit 110 may maintain the reception gain of the second amplifier 65 and a switching state of the switch 66 and may also perform a volume adjustment using a table corresponding to the inputted volume key signal. That is, when a volume key signal is inputted during a volume adjustment using the curved graph line A shown in FIG. 3, the control unit 110 may adjust the volume using the curved graph line B or C depending on the corresponding the number of inputs of depression of the volume level key, as discussed above. However, if no volume key signal is inputted, the control unit 110 may further determine whether the etiquette call mode is terminated (step 215). If the etiquette call mode is terminated, the control unit 110 may perform the normal call mode (step 217). For this, the control unit 110 may change the gains of the first and second amplifiers 62 and 65 to other gain values established for the normal call mode and may also send a control signal (SW_C) to the switch 66 so that the second amplifier 65 is connected directly to the D/A converter 68. Thereafter, the control unit 110 may determine whether a call mode terminating signal is inputted (step 219). Then the control unit 110 may return to the step 205 in case of no input of the call mode terminating signal, and may terminate the call mode in case a call mode terminating signal is received.

If the etiquette call mode is not terminated in the step 215, the control unit 110 may determine whether a call mode terminating signal is inputted (step 221). Then the control unit 110 returns to step 213 when no call mode terminating signal input is received. Otherwise, the call mode is terminated when a call mode terminating signal is received.

Meanwhile, according to the above discussion with regard to FIG. 4, when a volume level key signal is inputted in the etiquette call mode, the control unit 110 may change the reference level range corresponding to the inputted volume key signal. This is, however, exemplary only and not to be considered as a limitation of the present invention. Alternatively, when any volume key signal is inputted in the etiquette call mode, the control unit 110 may change the call mode to the conventional whisper call mode. Specifically, the control unit 110 may maintain the transmission gain of the first amplifier 62 to the maximum and change the reception gain of the second amplifier 65 to a new gain value established for the receiving volume level corresponding to the inputted volume key signal. That is, the control unit 110 may inactivate the volume adjuster 67 and control the switch 66 so that the second amplifier 65 is connected to the D/A converter 68.

The present invention is described hereinafter with reference to flowchart illustrations of user interfaces, methods, and computer program products according to embodiments of the invention. It will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which are executed via the processor of the computer or other programmable data processing apparatus, create means for implementing the functions specified in the flowchart block or blocks. These computer program instructions may also be stored in a tangible computer usable or tangible computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

And each block of the flowchart illustrations may represent a module, segment, or portion of code, which comprises one or more executable instructions for implementing the specified logical function(s). It should also be noted that in some alternative implementations, the functions noted in the blocks may occur out of the order shown. For example, two blocks shown in succession may in fact be executed substantially concurrently or the blocks may sometimes be executed in the reverse order, depending upon the functionality involved. The order of implementing the instructions in the blocks is determined by the interrelationship and interaction of the instructions. Thus, instructions that prepared data for subsequent instructions would be known in the art to be performed prior to the subsequent instruction. Otherwise the instructions may be performed in any order.

The above-described methods, according to the present invention, can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. An apparatus for providing an etiquette call mode, the apparatus comprising:
a radio frequency (RF) unit configured to transmit a sending call and to receive a received call in a call mode;
an audio processing unit;
a control unit configured to control operations of the RF unit and the audio processing unit, to activate a normal call mode in which reception gain for the received call is set based on a volume key signal, and responsive to a user input selection to activate the etiquette call mode in which reception gain for the received call is automatically set to a minimum or near minimum value and transmission gain for the sending call is automatically set to a maximum gain value;
wherein when the etiquette call mode is activated, the audio processing unit is controlled to:
establish the transmission gain to the maximum gain value,
establish the reception gain to the minimum or near minimum value,
amplify the received call by means of the established reception gain to generate an amplified voltage,
compare the amplified voltage to a predetermined maximum voltage and a predetermined minimum voltage of a predetermined reference level range, and
responsive to the amplified voltage being greater than the predetermined maximum voltage or less than the predetermined minimum voltage, reduce the amplified voltage to be less than or equal to the predetermined maximum voltage or increase the amplified voltage to be greater than or equal to the predetermined minimum voltage, respectively, thereby limiting an output level of the amplified received call to be within the predetermined reference level range.

2. The apparatus of claim 1, wherein the audio processing unit includes:
an analog-to-digital (A/D) converter configured to convert analog signals received from a microphone into digital signals;
a first amplifier configured to amplify the digital signals received from the A/D converter by means of the transmission gain;
a voice encoder configured to encode the amplified digital signals and then to send the encoded digital signals to the control unit;
a voice decoder configured to decode the received call received from the control unit;
a second amplifier configured to amplify the decoded received call by means of the reception gain;
a volume adjuster activated in the etiquette call mode and configured to limit the output level of the amplified received call to the given reference level range;
a digital-to-analog (D/A) converter configured to convert digital signals into analog signals and then to send the analog signals to a speaker; and
a switch located between the volume adjuster and the second amplifier and configured to send the amplified received call to one of the volume adjuster and the D/A converter according to a control signal from the control unit.

3. The apparatus of claim 2, wherein a gain value of the first amplifier is one of: a maximum gain value of the first amplifier and a specific value reduced from the maximum gain value of the first amplifier.

4. The apparatus of claim 1, wherein the control unit is further configured, when a volume key signal is inputted in the etiquette call mode, to change the reception gain to a specific gain value established depending on a receiving volume level corresponding to the inputted volume key signal, and to maintain the established transmission gain.

5. The apparatus of claim 1, wherein the reference level range is selected depending on a receiving volume level.

6. The apparatus of claim 5, wherein the control unit is further configured, when a volume key signal is inputted in the etiquette call mode, to:
change the reference level range according to the receiving volume level, and
control the audio processing unit to adjust the received call amplified by means of the reception gain to the changed reference level range.

7. A method of a mobile device, the method comprising:
activating a normal call mode in which reception gain for a received call is set based on a volume key signal;
responsive to a user input selection, activating an etiquette call mode in which reception gain for the received call is automatically set to a minimum or near minimum value and transmission gain for a sending call is automatically set to a maximum gain value;
establishing, when the etiquette call mode is activated, a transmission gain to the maximum gain value and establishing the reception gain to the minimum or near minimum value;
amplifying the received call by means of the established reception gain to generate an amplified voltage;
comparing the amplified voltage to a predetermined maximum voltage and a predetermined minimum voltage of a predetermined reference level range;
responsive to the amplified voltage being greater than the predetermined maximum voltage or less than the predetermined minimum voltage, reducing the amplified voltage to be less than or equal to the predetermined maximum voltage or increasing the amplified voltage to be greater than or equal to the predetermined minimum voltage, respectively, thereby limiting an output level of the amplified received call to be within the predetermined reference level range; and
outputting the output-level-limited received call through a speaker.

8. The method of claim 7, wherein the control unit is further configured to execute the step comprising:
changing, when a volume key signal is inputted in the etiquette call mode, the reception gain to a specific gain value established depending on a receiving volume level corresponding to an inputted volume key signal, and maintaining the established transmission gain;
amplifying the received call by means of the changed reception gain; and
outputting the amplified received call through the speaker.

9. The method of claim 7, further comprising:
changing, when a volume key signal is inputted in the etiquette call mode, the reference level range according to the receiving volume level;
adjusting the received call amplified by means of the reception gain to the changed reference level range; and
outputting the adjusted received call through the speaker.

10. An apparatus operable in a mobile communication device, comprising:

an A/D converter digitizing a transmit signal received through a microphone;
a first amplifier amplifying the digitized transmit signal at a maximum transmission gain in an etiquette call mode of the mobile communication device;
an encoder encoding the amplified digitized transmit signal;
a decoder decoding an encoded received signal and generating a decoded signal;
a second amplifier amplifying the decoded signal to generate an amplified decoded signal, the decoded signal being amplified in a normal call mode of the mobile communication device at a gain set based on a volume key signal, and amplified in the etiquette call mode at a minimum gain;
a switch receiving the amplified decoded signal, the switch having a first output and a second output;
a volume adjuster connected to the first output of the switch, the volume adjuster comparing the amplified decoded signal to a predetermined maximum voltage and a predetermined minimum voltage of a predetermined reference level range, and responsive to the amplified decoded signal being greater than the predetermined maximum voltage or less than or equal to the predetermined minimum voltage, reducing the amplified decoded signal to be less than or equal to the predetermined maximum voltage or increasing the amplified decoded signal to be greater than or equal to the predetermined minimum voltage, respectively, thereby limiting an output level of the amplified decoded received signal to be within the predetermined reference level range, wherein the output level is limited based on a selectable reference point curve;
a D/A converter connected to the second output of the switch and the volume adjuster;
a speaker receiving an output of the D/A converter, said speaker outputting the output of the D/A converter; and
a control unit activating the etiquette call mode responsive to a user input selection, and otherwise activating the normal call mode, receiving the encoded amplified digitized transmit signal from the encoder and providing the encoded received signal to the decoder.

11. The apparatus of claim 10, responsive to a signal from the control unit, the switch directs the received amplified decoded signal to one of the D/A convertor and the volume adjuster.

12. The apparatus of claim 10, wherein the volume adjuster is set at a default reference point.

13. The apparatus of claim 10, wherein responsive to a signal from the control unit, the volume adjuster selects one of the selectable reference points.

14. The apparatus of claim 13, wherein the selection of the selectable reference points is determined by a number of inputs of a volume key.

15. The apparatus of claim 11 wherein the control unit controls the switch to direct the received amplified decoded signal to the volume adjuster based on a received input signal.

16. The apparatus of claim 1, wherein the audio processing unit is configured for reducing the output level of the amplified received call when the output level of the amplified received call is higher than a specific value, and increasing the output level of the amplified received call when the output level of the amplified received call is lower than a further specific value.

17. The apparatus of claim 1, wherein the audio processing unit comprises a volume adjuster formed of an automatic gain controller or a compander.

18. The method of claim 7, wherein the limiting the output level of the amplified received call to the given reference level range comprising:
   reducing, when the output level of the amplified received call is higher than a specific value, the output level of the amplified received call; and
   increasing, when the output level of the amplified received call is lower than a further specific value, the output level of the amplified received call.

19. The apparatus of claim 10, wherein the volume adjuster is configured for reducing the output level of the amplified received call when the output level of the amplified decoded received call is higher than a specific value, and increasing the output level of the amplified decoded received call when the output level of the amplified received call is lower than a further specific value.

20. The apparatus of claim 10, wherein the volume adjuster is formed of an automatic gain controller or a compander.

* * * * *

UNITED STATES PATENT AND TRADEMARK OFFICE
CERTIFICATE OF CORRECTION

Page 1 of 1

PATENT NO.         : 8,768,304 B2
APPLICATION NO.    : 13/298554
DATED              : July 1, 2014
INVENTOR(S)        : Beak Kwon Son et al.

It is certified that error appears in the above-identified patent and that said Letters Patent is hereby corrected as shown below:

In the Claims

Column 12, Claim 11, Line 45 should read as follows:
--...the D/A converter and...--

Column 12, Claim 15, Line 55 should read as follows:
--...claim 11, wherein the...--

Signed and Sealed this
Sixteenth Day of September, 2014

Michelle K. Lee
*Deputy Director of the United States Patent and Trademark Office*